United States Patent [19]
Lin et al.

[11] Patent Number: 6,150,833
[45] Date of Patent: Nov. 21, 2000

[54] LCD PANEL POWER-UP TEST FIXTURE AND METHOD OF USING

[75] Inventors: Hong-Yu Lin; Fang I. Shieh, both of Hsinchu, Taiwan

[73] Assignee: Industrial Technology Research Institute, Hsinchu, Taiwan

[21] Appl. No.: 09/243,952

[22] Filed: Feb. 3, 1999

[51] Int. Cl.[7] .................................................. G01R 31/02
[52] U.S. Cl. .......................... 324/770; 269/110; 269/203; 269/303; 345/144
[58] Field of Search ................................. 324/158.1, 754, 324/755, 770; 269/90, 203, 110, 303; 345/144

[56] References Cited

U.S. PATENT DOCUMENTS

| | | | |
|---|---|---|---|
| 3,612,508 | 10/1971 | Rise | 269/90 |
| 5,003,254 | 3/1991 | Hunt et al. | 324/158.1 |
| 5,954,106 | 9/1999 | Huang | 144/286.5 |

*Primary Examiner*—Safet Metjahic
*Assistant Examiner*—Jimmy Nguyen
*Attorney, Agent, or Firm*—Tung & Associates

[57] ABSTRACT

An adjustable LCD panel power-up test fixture and a method for using the fixture are disclosed. In a preferred embodiment, an adjustable test fixture is constructed by mounting removable side frames onto a substantially planar base plate with conductive elements provided on the top surfaces of the side frames. The side frames are arranged and mounted in such a way that one side frame slidingly engages another for fixing a pre-selected length of the side frame necessary for testing the LCD panel. In an alternate embodiment, the base plate is not used where four side frames slidingly engaging each other to form an adjustable test frame. The four side frames are each provided with a horizontal portion and a vertical portion. The vertical portions of the four side frames are of substantially the same height, while the horizontal portions are provided with a recessed slot for engaging the horizontal portions of the other side frames. Once a suitable size is adjusted, the four side frames may be locked together by using a mechanical locking means prior to the testing of the LCD panel. The adjustable test fixture may further be provided with an upper plate for each horizontal portion of the side frames equipped with flexible tubular sections on a bottom surface of the upper plate such that a suitable pressure may be applied between the conductive leads on the LCD panel and the conductive elements on the PCB provided on the top surfaces of the side frames. The present invention novel apparatus of an adjustable test fixture for LCD panel power-up test allows the testing of any size LCD panels in the same test fixture by suitably adjusting the length of each side frame in the fixture.

26 Claims, 7 Drawing Sheets

Schematic Diagram of a-Si TFT/LCD

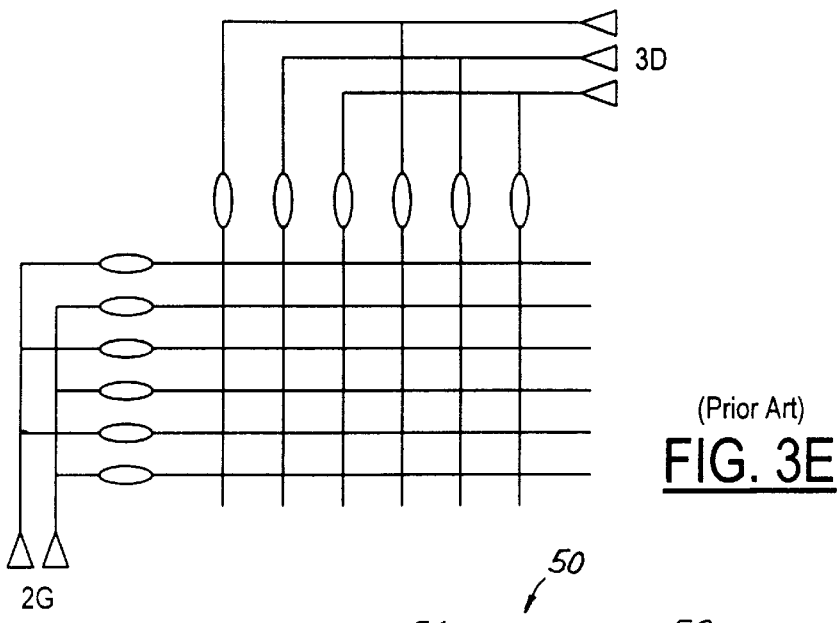
(Prior Art)
FIG. 3E
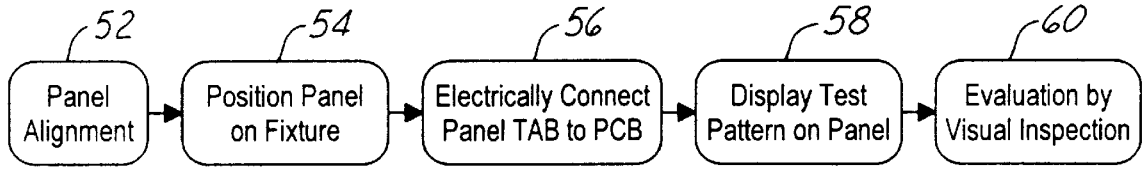
FIG. 4
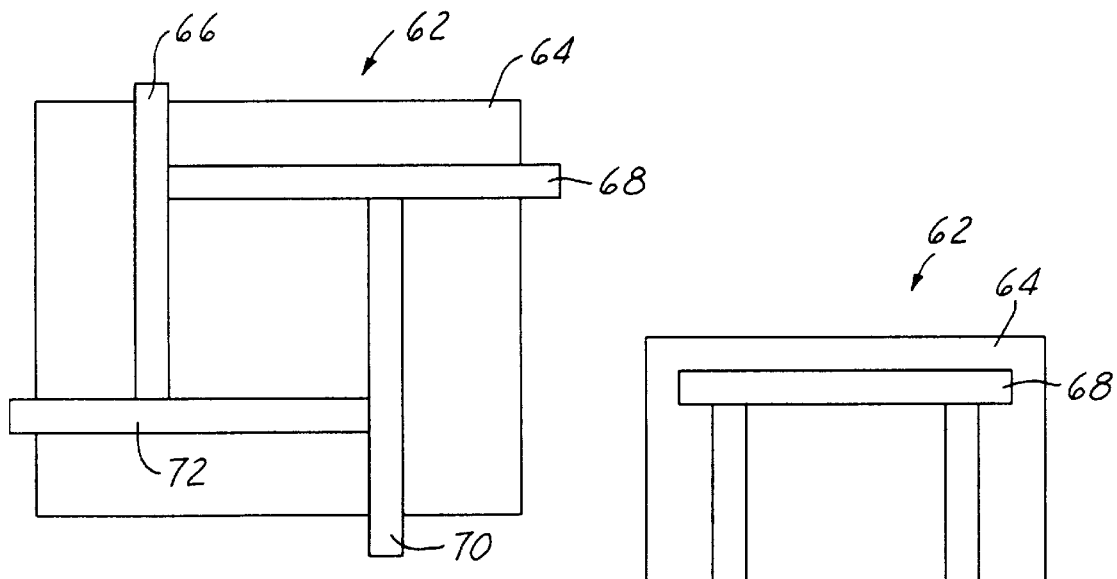
FIG. 5A
FIG. 5B

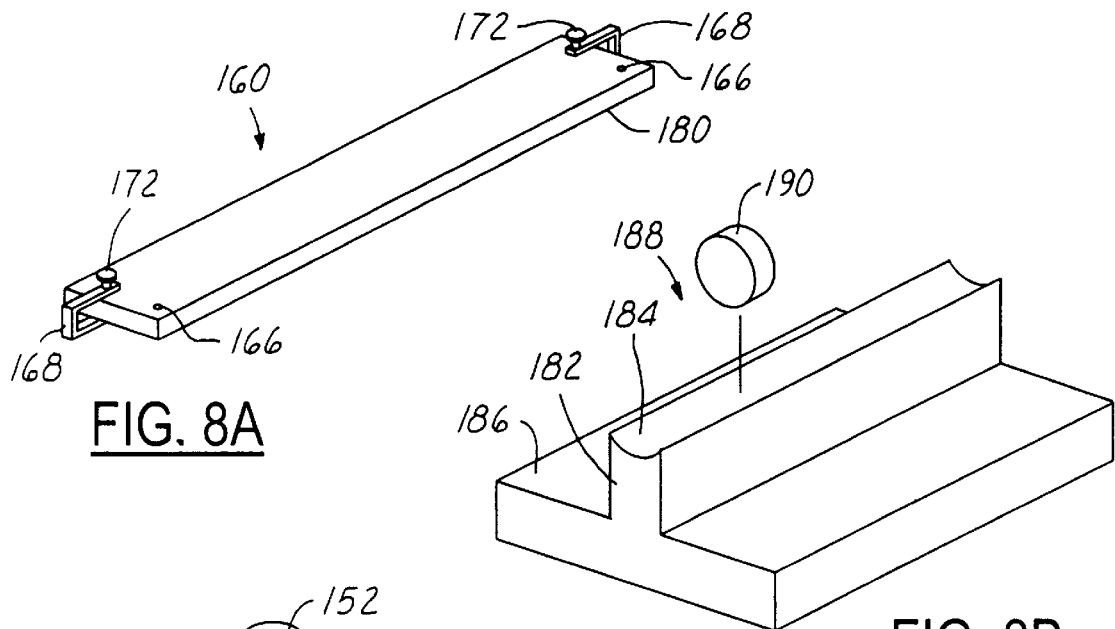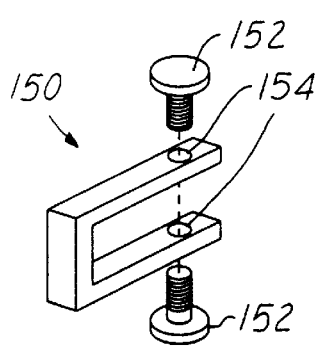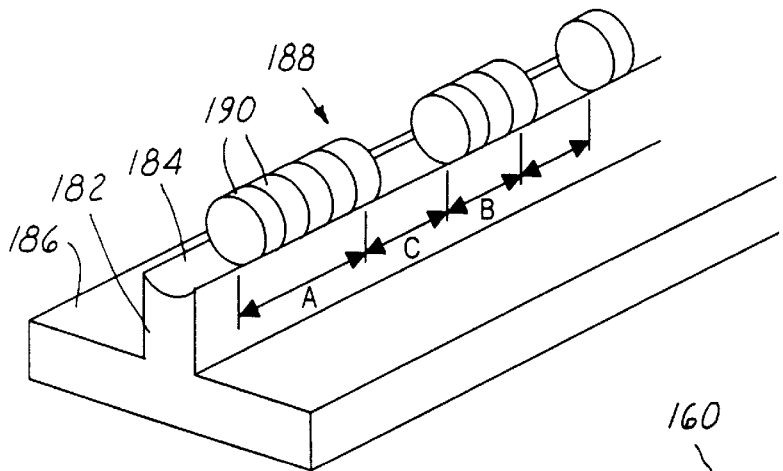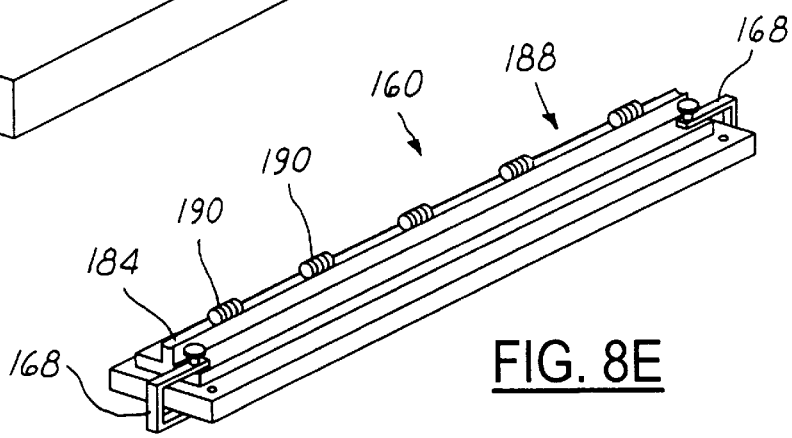
FIG. 8A
FIG. 8B
FIG. 8C
FIG. 8D
FIG. 8E

LCD PANEL POWER-UP TEST FIXTURE AND METHOD OF USING

FIELD OF THE INVENTION

The present invention generally relates to a LCD panel power-up test fixture and a method of using the fixture and more particularly, relates to an adjustable LCD panel power-up test fixture that is provided with an adjustable frame such that any size LCD panels can be tested and a method of using such adjustable test fixture.

BACKGROUND OF THE INVENTION

In recent years, large liquid crystal cells have been used in flat panel displays. The liquid crystal cells are normally constructed by two glass plates joined together with a layer of a liquid crystal material sandwiched inbetween. The glass substrates have conductive films coated thereon with at least one of the substrates being transparent. The substrates are connected to a source of power to change the orientation of the liquid crystal material. A possible source of power is a thin film transistor that is used to separately address areas of the liquid crystal cells at very fast rates. The TFT driven liquid crystal cells can be advantageously used in active matrix displays such as for television and computer monitors.

As the requirements for resolution of liquid crystal monitors increase, it becomes desirable to address a large number of separate areas of a liquid crystal cell, called pixels. For instance, in a modem display panel, more than 3,000,000 pixels may be present. At least the same number of transistors must therefore be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched or tri-layered. The performance of a TFT and its manufacturing yield or throughput depend on the structure of the transistor. For instance, the inverted staggered back channel etched TFT can be fabricated with a number of six masks, whereas other types of inverted staggered TFT require a minimum number of nine masks.

A second type of TFT is made by using a polysilicon material. Polysilicon is more frequently used for displays that are designed in a smaller size, for instance, up to three inch diagonal for a projection device. At such a small size, it is economical to fabricate the display device on a quartz substrate. Unfortunately, large area display devices cannot be normally made on quartz substrates. The desirable high performance of polysilicon can therefore be realized only if a low temperature process can be developed to enable the use of non-quartz substrates. For instance, in a more recently developed process, large area polysilicon TFT can be manufactured at processing temperatures of less than 600° C. In the process, self-aligned transistors are made by depositing polysilicon and gate oxide followed by source/drain regions which are self-aligned to the gate electrode. The device is then completed with a thick oxide layer, an ITO layer and aluminum contacts.

Polysilicon TFTs have the advantage of a high charge current and the drawback of a high leakage current. It is difficult to maintain the voltage in a pixel until the next charge in a polysilicon TFT due to its high leakage current. Polysilicon also allows the formation of CMOS devices, which cannot be formed by amorphous silicon. For the fabrication of larger displays, a higher mobility may be achieved by reducing the trap density around the grain boundaries in a hydrogenation process.

FIG. 1 shows an enlarged, cross-sectional view of a conventional amorphous silicon TFT structure. A typical active matrix LCD panel 10 is shown which consists of an array of pixels 12. Each pixel 12 is activated by addressing simultaneously a designated drive line 14, or data line, and gate line 16. A drive element 18, which is a thin film transistor, is associated with each pixel. The drive lines 14, gate lines 16, pixels 12 and pixel drive elements 18 are deposited on a clear glass substrate by a photolithographic process. In a device with high pixel densities, the close proximity of the gate lines and drive lines, and the complexity of forming the drive elements for the pixels, i.e., the thin film transistors, defects are frequently formed in the structure during the fabrication process. For instance, in an LCD array of 640 by 480 pixel elements, a few structural defects in the circuits of the pixels are frequently observed during reliability tests.

Traditional test methods for high density LCD panels require physical contacts to be made such that connection to and testing of each individual row/column intersection within a panel array can be made. In more advanced testing methods, advanced probing technology has been used for establishing reliable contacts among the densely populated pixel elements. For instance, one of such test can be conducted in a commercially available equipment as shown in FIGS. 2A and 2B. An LCD panel 10 is provided with a plurality of conductive leads 20 in the horizontal direction and a plurality of conductive leads 22 in the vertical direction. The conductive leads 20, 22 are provided in the form of tape automated bonding (TAB) leads. The plurality of conductive leads 22 are connected to the gate lines of the LCD panel 10, while the conductive leads 20 are connected to the drive lines of the LCD panel 10. A conventional test fixture 30 is provided which includes a vertical side frame 32 and a horizontal side frame 34. On the vertical side frame 32, a multiplicity of conductive elements (not shown) are provided on a printed circuit board 36, or a Y card, On the horizontal side frame 34, a multiplicity of conductive elements (not shown) are provided on a printed circuit board 38, or the X card. The printed circuit boards 36, 38 are mounted to the side frames 32, 34 respectively by locating pins 40.

The printed circuit boards 36, 38 are constructed by conventional techniques such as aluminum traces formed on an insulating board such as epoxy. The horizontal side frame 34 and the vertical side frame 32 are permanently mounted on a base frame 28 which also provides guiding blocks 26 in the test fixture 30 shown in FIG. 2A. The configuration of the fixture 30 is fixed such that it can only be used for an LCD panel that has the specific dimensions, for instance, a 3-inch×4-inch LCD panel. FIG. 2B is a perspective view showing the LCD panel 10 positioned on the test fixture 30. In the position shown in FIG. 2B the conductive leads on the PCB boards 36, 38 establish electrical communication with the conductive elements on TAB 22, 20 of the LCD panel 10. A test of the LCD panel 10 can thus be conducted. When a different sized LCD panel is to be tested, a different test fixture must be provided to accomplish such task. The test fixture shown in FIGS. 2A and 2B is expensive to build due to the high accuracy required and the expensive material used for achieving dimensional stability at different ambient temperatures.

By utilizing the conventional test fixture 30 shown in FIG. 2A, a plurality of conventional tests can be conducted. These tests are shown in FIGS. 3A–3E. For instance, FIG. 3A illustrates a simplified, equivalent circuit for a test that can be conducted with a single gate line 42 and a single drive line 44. In this configuration, all the gate lines 46 and all the drive lines 48 are shorted together, respectively to form a single gate line 42 and a single drive line 44. In this connecting point contact design of 1G1D, a test can be carried out at low cost for a quick detection of any open circuits since only one input signal is required for the gate line and for the drive line, respectively. In this configuration, all the LCD panel ITO pads are connected to the printed circuit board on the test fixture, while the conductor layout of the gate and data PCB are shorted, respectively. This is a low cost test method where the PCB can be fabricated at low cost and reused.

Contrary to the 1D1D test configuration, a full contact probing method is shown in FIG. 3B. In this configuration, 6 individual gate lines 46 and 6 individual drive lines 48 are utilized to enable a variety of tests based on different configurations such as 1G1D, 1G2D, 2G2D, 2G3D, and full contact probing. The pressure conductive rubber (PCR) utilized in the test fixture need not be severed and need not be changed. The drawback of the full contact probing configuration is that the PCB is only adapted to accept a single LCD panel, i.e., its ITO pattern and pitch. When different ITO pattern and pitch are involved, a new design PCB must be utilized. Other test configurations such as 1G2D, 2G2D, and 2G3D are shown in FIGS. 3C, 3D and 3E, respectively.

It is therefore an object of the present invention to provide an LCD panel power-up test fixture that does not have the drawbacks or shortcomings of the conventional fixtures.

It is another object of the present invention to provide an LCD panel power-up test fixture that is adjustable such that panels of different sizes can be tested on the same fixture.

It is a further object of the present invention to provide an adjustable LCD panel power-up test fixture by providing a base plate and mounting at least two side frames on the base plate wherein the side frames may be slidingly adjusted to accommodate panels of different sizes.

It is another further object of the present invention to provide an adjustable LCD panel power-up test fixture wherein at least three side frames are utilized which slidingly engaging each other for adjusting to a specific LCD panel size.

It is still another object of the present invention to provide an adjustable LCD panel power-up test fixture wherein printed circuit boards are provided on the side frames for engaging TAB leads on the LCD panel for establishing electrical communication thereinbetween.

It is yet another object of the present invention to provide an adjustable LCD panel power-up test fixture wherein four side frames each having an L-shape slidingly engaging each other for accommodating a specific LCD panel size.

It is still another further object of the present invention to provide an adjustable fixture for LCD panel power-up test by providing four side frames slidingly engaging each other and each is provided with conductive elements on a top surface of the frame.

It is yet another further object of the present invention to provide an adjustable fixture for LCD panel power-up test which is constructed by four side frames each having a top surface provided with printed circuit boards and conductive elements on the boards such that LCD panels of any size may be tested.

SUMMARY OF THE INVENTION

In accordance with the present invention, an adjustable LCD panel power-up test fixture and a method for testing LCD panels of different sizes are provided.

In a preferred embodiment, an adjustable LCD panel power-up test fixture is provided which includes a base plate that has a sufficiently planar area adapted for accommodating at least three side frames for removably mounting to the plate, each of the at least three side frames has a substantially elongated body defined by a top planar surface and a parallel bottom planar surface, each of the top planar surface is equipped with a multiplicity of conductive elements for establishing electrical communication with an LCD panel to be tested, a first side frame removably mounted to the base plate, and at least a second side frame and a third side frame positioned on the base plate, the second side frame slidingly engaging the first side frame such that a pre-selected length of the first side frame required for testing the LCD panel may be fixed, the third side frame slidingly engaging the second side frame such that a pre-selected length of the second side frame required for testing the LCD panel may be fixed.

In the adjustable LCD panel power-up test fixture, the second side frame and the third side frame each is equipped with an upside-down U-shaped end portion for sliding on the first side frame and the second side frame, respectively. The upside-down U-shaped end portion may further include means for locking the second side frame and the third side frame to the first side frame and the second side frame, respectively at a pre-selected length of the respective side frame for testing the LCD panel. The means for locking the first and the second side frames together may be a set screw and a threaded aperture.

In the adjustable LCD panel power-up test fixture, a multiplicity of conductive elements are provided on removable cards, or removable printed circuit boards. The test fixture may further include a fourth side frame positioned on the base plate slidingly engaging the third side frame such that a pre-selected length of the third side frame required for testing the LCD panel is fixed. The multiplicity of conductive elements are provided on removable cards, or printed circuit boards which are mounted on the top planar surfaces on the side frames by locating pins. The test fixture may further include a first multiplicity of conductive elements provided on a top planar surface of the first side frame for establishing electrical communication with a multiplicity of drive lines on the LCD panel. The test fixture may further include a second multiplicity of conductive elements on a top planar surface of the second side frame for establishing electrical communication with a multiplicity of gate lines on the LCD panel. The test fixture may further include a first multiplicity of conductive elements and a second multiplicity of conductive elements on the top planar surfaces of the first and second side frames for establishing electrical communication with a multiplicity of drive lines and gate lines, respectively on the LCD panel.

In an alternate embodiment, an adjustable fixture for LCD panel power-up test is provided which includes a test fixture constructed by four side frames each having an L-shape, a first side frame that includes a first vertical portion and a first horizontal portion, the first horizontal portion has a base portion and a tip portion extending horizontally outwardly from a top of the first vertical portion, the base portion has a recessed slot for slidingly engaging a fourth side frame, the tip portion is adapted for slidingly engaging a recessed slot in a second side frame, a second side frame that includes a second vertical portion of substantially the same height as the first vertical portion and a second horizontal portion, the second horizontal portion has a base portion and a tip portion extending horizontally outwardly from a top of the second vertical portion, the base portion has a recessed slot for slidingly engaging the first side frame, the tip portion is adapted for slidingly engaging a recessed slot in a third side frame, a third side frame which includes a third vertical portion of substantially the same height as the second vertical portion and a third horizontal portion, the third horizontal portion has a base portion and a tip portion extending horizontally outwardly from a top of the third vertical portion, the base portion has a recessed slot for slidingly engaging the second side frame, the tip portion is adapted for slidingly engaging a recessed slot in a fourth side frame, a fourth side frame which includes a fourth vertical portion of substantially the same height as the third vertical portion and a fourth horizontal portion, the fourth horizontal portion has a base portion and a tip portion extending horizontally outwardly from a top of the fourth vertical portion, the base portion has a recessed slot for slidingly engaging the third side frame, the tip portion is adapted for slidingly engaging a recessed slot in the first side frame, and each of the first, second, third and fourth horizontal portion has a substantially flat top surface equipped with a multiplicity of conductive elements for establishing electrical communication with an LCD panel to be tested.

In the adjustable fixture for LCD panel power-up test, the first, second, third and fourth horizontal portions have substantially the same length. The multiplicity of conductive elements for establishing electrical communication with a LCD panel to be tested are provided on removable cards, or removable printed circuit boards. The removable cards may have a multiplicity of conductive elements on top and are mounted on the flat top surface by locating pins. The top of the first, second, third and fourth vertical portion further includes means for locking the top portion of the horizontal portion in the recessed slot of an adjacent side frame. The means for locking a tip portion to a recessed slot includes a set screw and a threaded aperture in the top of the vertical portion of a side frame.

In the adjustable fixture for LCD panel power-up test, the electrical communication made between the multiplicity of conductive elements and the LCD panel is removable. The adjustable fixture may further include a first multiplicity of conductive elements on a top planar surface of the first side frame for establishing electrical communication with a multiplicity of drive lines on the LCD panel. A test fixture may further include a second multiplicity of conductive element on a top planar surface of the second side frame for establishing electrical communication with a multiplicity of gate lines on the LCD panel.

The present invention is further directed to a method for testing an LCD panel in a power-up test by using an adjustable test fixture similar to that described in the alternate embodiment above which includes the operating steps of first providing an adjustable test fixture similar to that described in the alternate embodiment above, and positioning an LCD panel on top of the adjustable fixture, the LCD panel has a multiplicity of conductive leads provided on at least one peripheral edge on at least one side of the side panel for establishing electrical communication with the multiplicity of conductive elements on the side frame.

The method for testing an LCD panel in a power-up test by using an adjustable test fixture may further include the step of pressing down on the multiplicity of conducting leads and the multiplicity of conductive elements by an upper plate to ensure electrical communication between the leads and the element. The method may further include the step of clamping the upper plate to the horizontal portion of the side frame with the LCD panel and the conductive elements sandwiched therebetween. The multiplicity of conductive elements are provided on a printed circuit board. The multiplicity of conductive leads on the LCD panel are provided in tape automated bonding (TAB) form. The method may further include the step of establishing electrical communication between the LCD panel and the test fixture by contacting TAB leads on the LCD panel with a printed circuit board on the test fixture.

BRIEF DESCRIPTION OF THE DRAWINGS

These and other objects, features and advantages of the present invention will become apparent from the following detailed description and the appended drawings in which:

FIG. 3E is a 2G3D configuration for a conventional LCD panel power-up test.

FIG. 4 is a process flow chart for the present invention method of testing LCD panels with an adjustable fixture.

FIG. 5A is an illustration of a preferred embodiment of the present invention adjustable test fixture with four side frames.

FIG. 5B is an illustration of a present invention adjustable test frame with three side frames.

FIG. 8A is a perspective view of an upper plate used in the present invention adjustable test fixture.

FIG. 8B is a perspective view of the underside of the present invention upper plate.

FIG. 8C is a perspective view of the clamp used in the present invention adjustable test fixture.

FIG. 8D is a perspective view of the underside of the upper plate for the present invention adjustable test fixture having tubular sections positioned on top.

FIG. 8E is a perspective view of an underside of the upper plate of the present invention adjustable test fixture with tubular sections positioned corresponding to the TAB leads on an LCD panel.

DETAILED DESCRIPTION OF THE PREFERRED AND ALTERNATE EMBODIMENT

Figure 1:
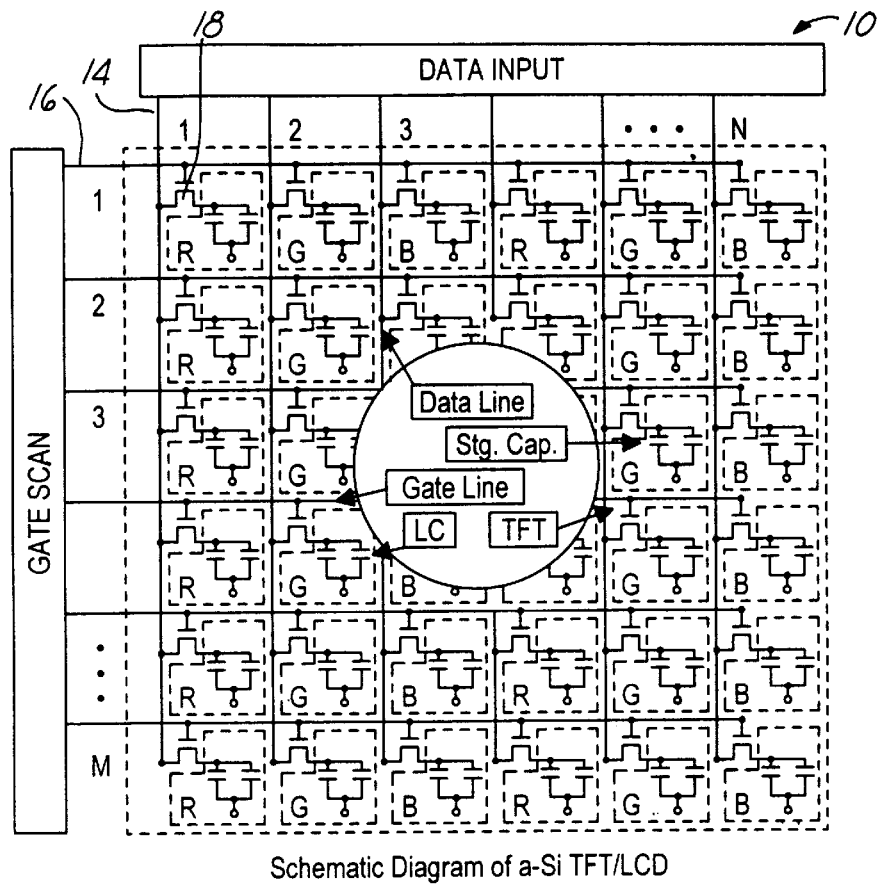
FIG. 1 is an enlarged, plane view of a typical, conventional amorphous silicon TFT/LCD layout showing the drive lines and gate lines for connecting all pixels.
Figure 3A:
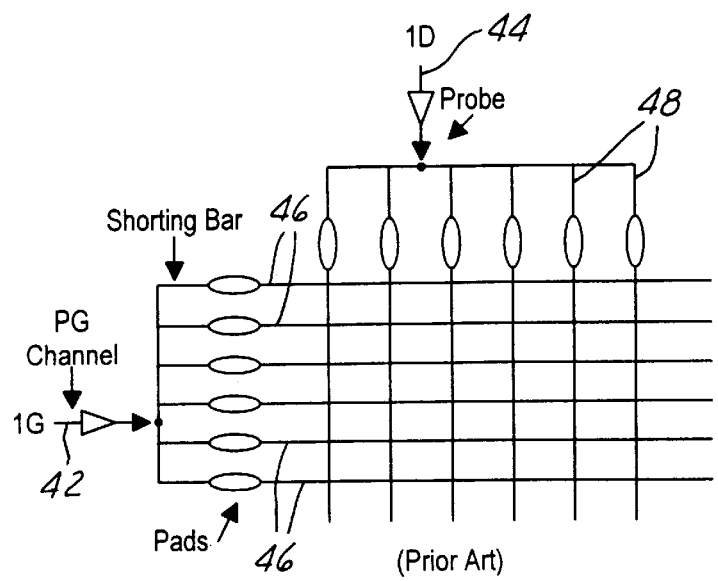
FIG. 3A is a 1G1D configuration for a conventional LCD panel power-up test.
Figure 2A:
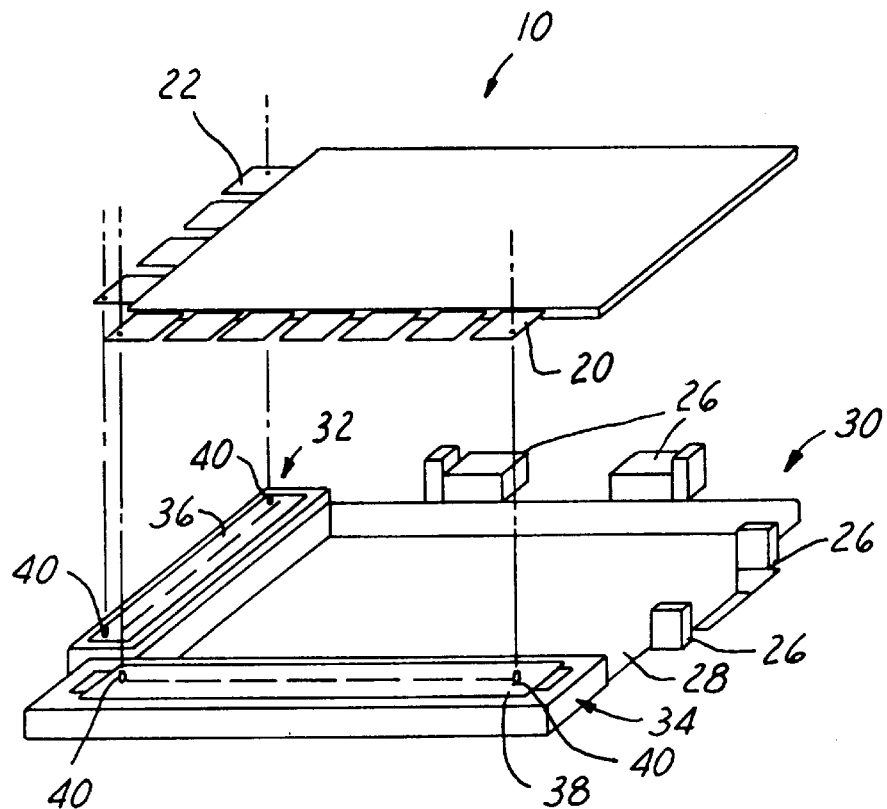
FIG. 2A is a perspective view of a conventional LCD panel positioned above a conventional test fixture which cannot be adjusted for different sized LCD panels.
Figure 2B:
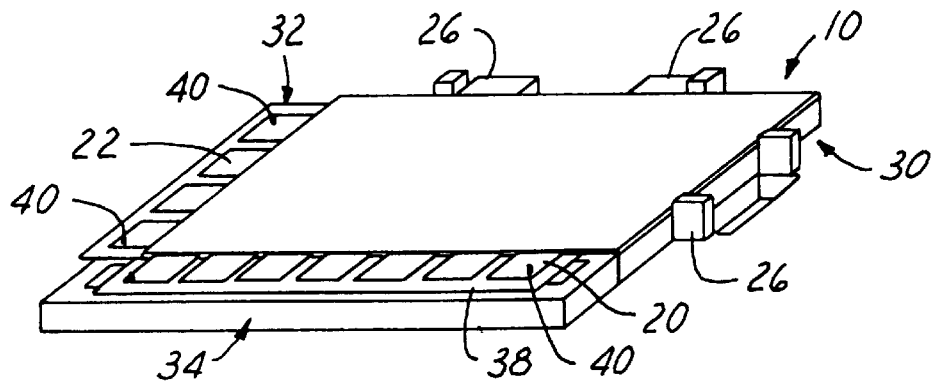
FIG. 2B is a perspective view of the LCD panel positioned on the test fixture for testing.
Figure 3B:
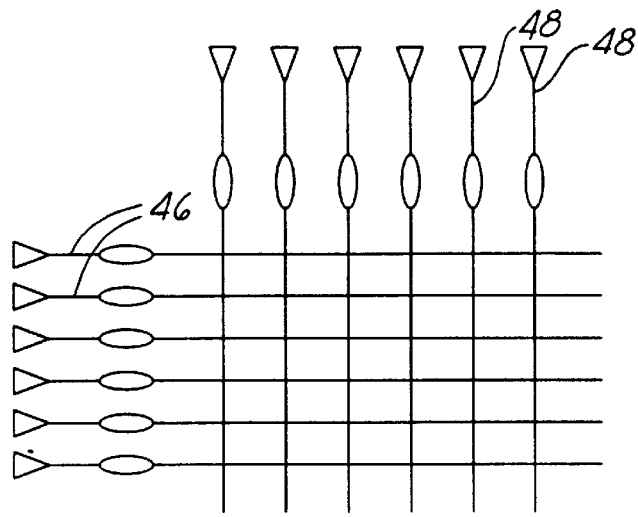
FIG. 3B is a full contact probing configuration for a conventional LCD panel power-up test.
Figure 3C:
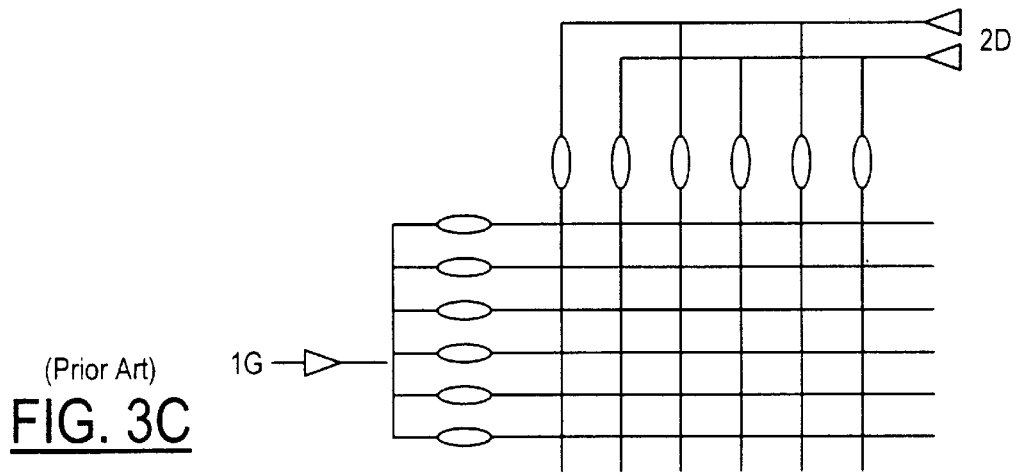
FIG. 3C is a 1G1D configuration for a conventional LCD panel power-up test.
Figure 3D:
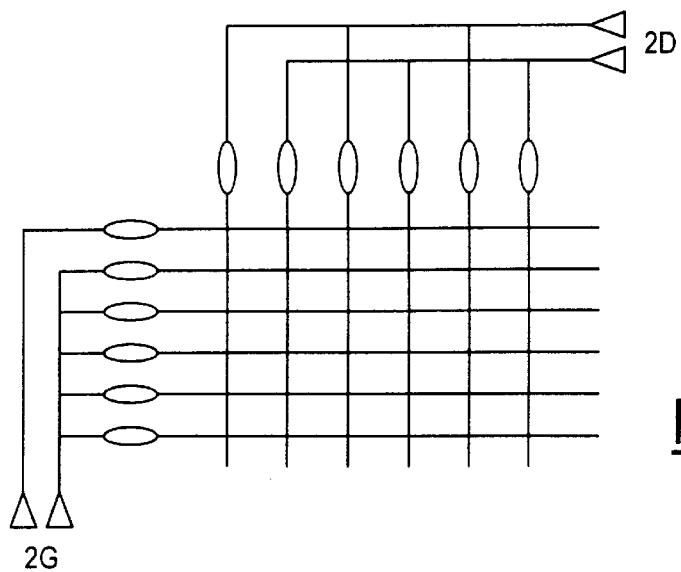
FIG. 3D is a 2G2D configuration for a conventional LCD panel power-up test.

The present invention discloses an adjustable LCD panel power-up test fixture that includes a substantially planar base plate and a plurality of side frames mounted thereon. The side frames are arranged in such a way that one frame slidingly engages another frame such that the length of the frame used for testing can be suitably adjusted to fit any size LCD panels. For instance, each of the side frames may have a substantially elongated body that is defined by a parallel top and bottom planar surface, with the top planar surface equipped with a multiplicity of conductive elements used for establishing electrical communication with the LCD panel tested. The side frames may be suitably equipped with an upside-down U-shaped end portion for slidingly engaging a second side frame such that a pre-selected length of the first side frame required for testing the LCD panel may be fixed. The adjustable LCD panel power-up test fixture further includes a locking means for locking the side frames together once a pre-selected length has been fixed. The locking means may include a set screw and a threaded aperture through the side frames. A maximum of four side frames may be mounted on the substantially planar base plate for the purpose of testing any size LCD panels.

In testing a conventional LCD panel, a first multiplicity of conductive elements may be provided on the top planar surface (i.e., on a printed circuit board) of the first side frame for establishing electrical communication with a multiplicity of drive lines on the LCD panel tested. Similarly, a second multiplicity of conductive elements positioned on a top planar surface of a second side frame may be provided for establishing electrical communication with a multiplicity of gate lines on the LCD panel.

In an alternate embodiment, the present invention novel adjustable test fixture for LCD panel power-up test may be provided without the substantially planar base plate. In this embodiment, the test fixture is constructed by four side frames each having an L-shape. Each of the side frame is constructed by a vertical portion and a horizontal portion with the horizontal portion consisting of a base portion and a tip portion that extends horizontally outwardly from a top of the vertical portion. The base portion of the horizontal portion has a recessed slot for slidingly engaging another side frame, while the top portion of the horizontal portion is adapted for slidingly engaging a recessed slot in a different side frame. A square or rectangular shaped test fixture frame is therefore constructed by the four side frames such that any size LCD panel may be tested. For establishing electrical communication with the LCD panel tested, on the flat top surface of the side frames, a multiplicity of conductive elements is provided for connecting to the LCD panel. The conductive elements may be suitably provided in the form of a printed circuit board for contacting the TAB leads on the LCD panel. A non-permanent connection can be advantageously made by pressing the terminals together under a pressure by an upper plate clamped to the side frames. The underside of the upper plate may be provided with a suitable ridge portion that accommodates a multiplicity of flexible tubular spacers that can be pre-arranged in any form to accommodate the TAB leads on the LCD panel.

The present invention further discloses a method for testing an LCD panel in a power-up test by using an adjustable test fixture. The method can be carried out by first providing an adjustable test fixture as that previously described in the preferred and in the alternate embodiment. An LCD panel is then positioned on top of the adjustable test fixture with a multiplicity of conductive leads provided on at least one peripheral edge of at least one side of the LCD panel for establishing electrical communication with the multiplicity of conductive elements on the side frame that is normally provided in a printed circuit board. A satisfactory contact between the conductive leads is ensured by pressing an upper plate on top and clamping with a C-clamp.

Referring initially to FIG. 4, wherein a process flow chart 50 for the present invention novel method of testing an LCD panel by an adjustable test fixture is shown. It is seen that in the first step 52, a robot is used to adjust the position of an LCD panel on a conveyor by a CCD device. In the process, the CCD device reads the panel identification number and feeds the data to a central processing unit. The LCD panel is then positioned on the test fixture by a robot, as shown in step 54, for contacting conductive leads and making suitable alignment adjustments. The LCD panel equipped with TAB leads positioned on the test fixture is then accurately repositioned such that electrical contacts between the TAB leads on the LCD panel and the conductive elements on the printed circuit board are in intimate contact after a pressure is placed on the contacts by an upper plate and a mechanical clamping means. This is shown in step 56. In the next step 58, a test pattern display data is fed from a pattern generator to the LCD panel for displaying the test pattern on the panel. In the last step 60 of the process, the technician visually inspects the LCD panel to evaluate the quality/reliability of the circuits such that LCD panels that have defects in the circuits are identified and rejected.

Figures 5C, 6:
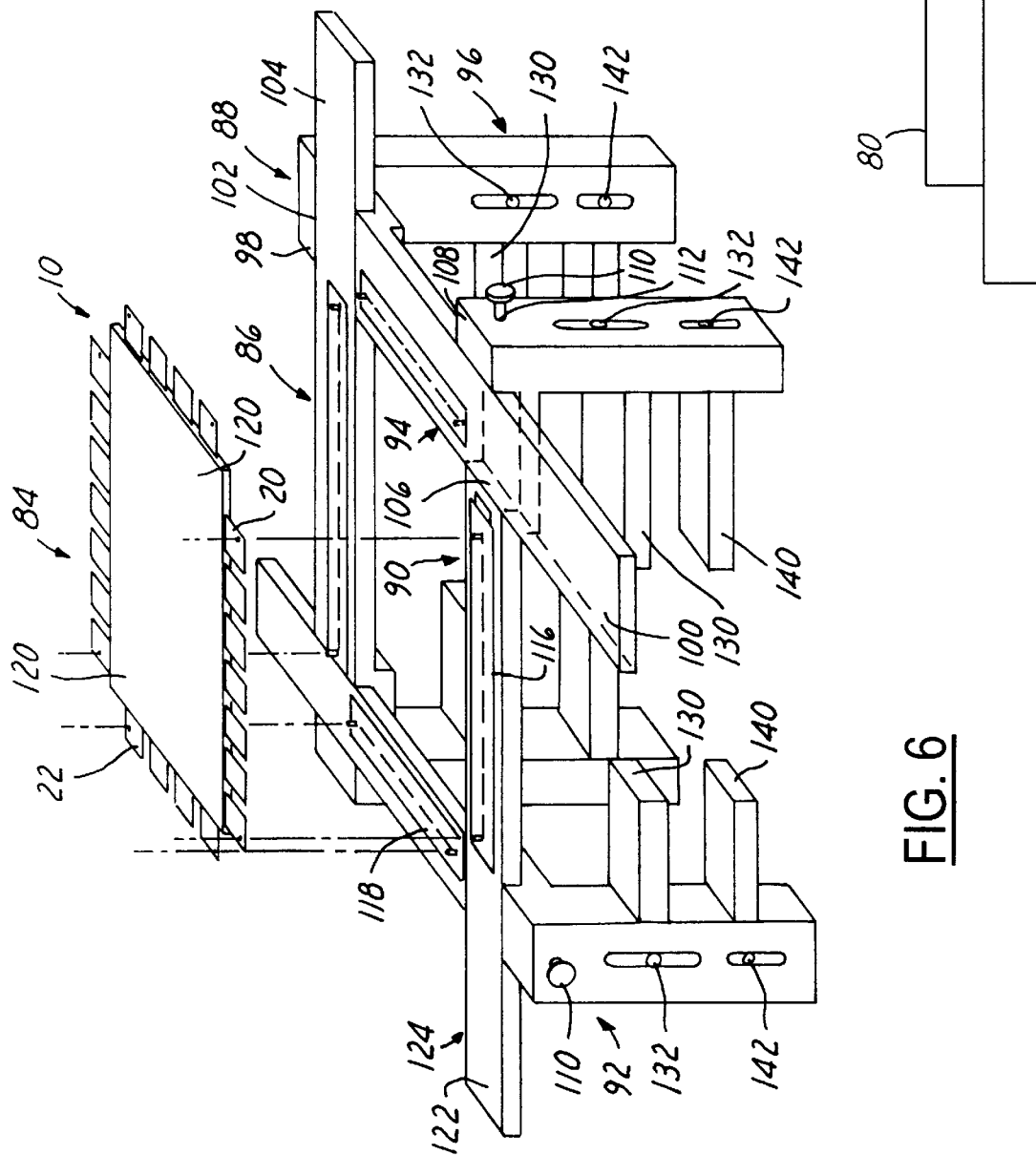
FIG. 5C is a cross-sectional view illustrating the sliding engagement used in the present invention adjustable fixture in a preferred embodiment.
FIG. 6 is a perspective view of an alternate embodiment of the present invention adjustable test fixture constructed by four side frames.

The present invention test fixture 62 is shown in FIGS. 5A, 5B and 5C. In FIG. 5A, the present invention adjustable test fixture 62 is built on a substantially planar base plate 64 with four side frames 66, 68, 70 and 72. In a different configuration shown in FIG. 5B, only three side frames 66, 68 and 70 are used. A cross-sectional view of the adjustable test fixture 62 shown in FIG. 5C better illustrates the manner in which the side frames 68, 66 are mounted on the substantially planar base plate 64. While FIGS. 5A and 5B are shown in a greatly simplified manner, the side frame 68 is equipped with an upside-down U-section 78 for engaging the side frame 66 in a sliding manner. Once a suitable, pre-selected length of the side frame 66 is reached, a set screw 74 threaded through an aperture 76 is used to lock the position of side frame 68 on the side frame 66. It should be noted that, while not shown, the side frame 66 is first attached to the substantially planar base plate 64 to enable other side frames for making sliding engagement. On the top surface 80 and 82 for the side frames 68, 66 respectively, conductive elements are provided in the form of printed circuit board (not shown) which are attached to the top surfaces 80, 82 by locating pins (not shown). A more detailed description of these features will be given in the description for the alternate embodiment shown in FIG. 6.

In the preferred embodiment for the present invention adjustable test fixture shown in FIG. 5A, the multiplicity of conductive elements (not shown) provided on the top surface 82 of the side frame 66 may be connected to the gate lines of an LCD panel to be tested, while the conductive elements on the printed circuit board mounted on the top surface 80 of the side frame 68 may be connected to the drive lines of the LCD panel tested. It should be noted that, in the present invention adjustable test fixture for LCD panel power-up test, a minimum of two side frames are required for mounting on the substantially planar base plate 64.

Depending on the TAB leads configuration on the LCD panel, either a two-side frame, three-side frame or four-side frame configuration can be suitably used for testing an LCD panel by the present invention novel apparatus.

FIG. 6 shows an alternate embodiment of the present invention adjustable test fixture 84. In the perspective view shown in FIG. 6, an LCD panel 10 is positioned on top of the adjustable test fixture 84 for a panel power-up test. In this alternate embodiment, four side frames, i.e., a first side frame 86, a second side frame 88, a third side frame 90 and a fourth side frame 92 are assembled together to form the novel test fixture 84. Each of the side frames is constructed in a substantially L-shape that has a vertical portion and a horizontal portion. For instance, for the second side frame 88, a horizontal portion 94 is integrally formed with the vertical portion 96 and extends from a top of the vertical portion upwardly. The horizontal portion 94 is further constructed with a base portion 98 and a tip portion 100. The base portion 98 is provided with a recessed slot 102 for slidingly engaging a tip portion 104 of the first side frame member 86. Similarly, the tip portion 100 of the second side frame 88 slidingly engages a recessed slot 106 formed in the base portion 108 of the third side frame 90. The sliding engagement of the tip portions in the recessed slot allows the present invention adjustable test fixture 84 to make infinite adjustments such that any suitable size LCD panel may be tested in the present invention adjustable fixture.

Once the suitable dimension of the test fixture 84 is adjusted, set screw 110 engages a threaded aperture 112 to lock the position between the various side frames.

Conductive leads (not shown) formed on the X card 116 and Y card 118, which are both printed circuit boards, are used for establishing electrical communication with the TAB leads 20, 22 that are provided on the peripheral edges 120 of the LCD panel 10. The engagement between the conductive leads on the TABs 20, 22 and the conductive leads on the X card 116, Y card 118 are shown in more detail in FIGS. 7 and 8.

The present invention novel adjustable test fixture 84 is further provided with means 130 and 140 for supporting a back light (not shown) and a circuit driving board (not shown), respectively. The supporting means 130, 140 are attached to the vertical portion 96 of the side frames by mechanical means 132 and 142. It should be noted that, the attached means 130, 140 may also be suitably used for supporting other components for an LCD panel during a test procedure.

Figure 7A:
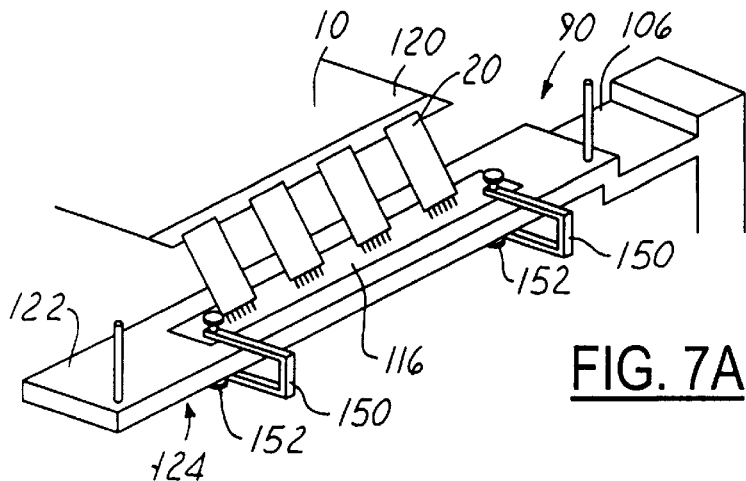
FIG. 7A is a perspective view of a side frame of the adjustable test fixture having an LCD panel positioned on top.
Figure 7B:
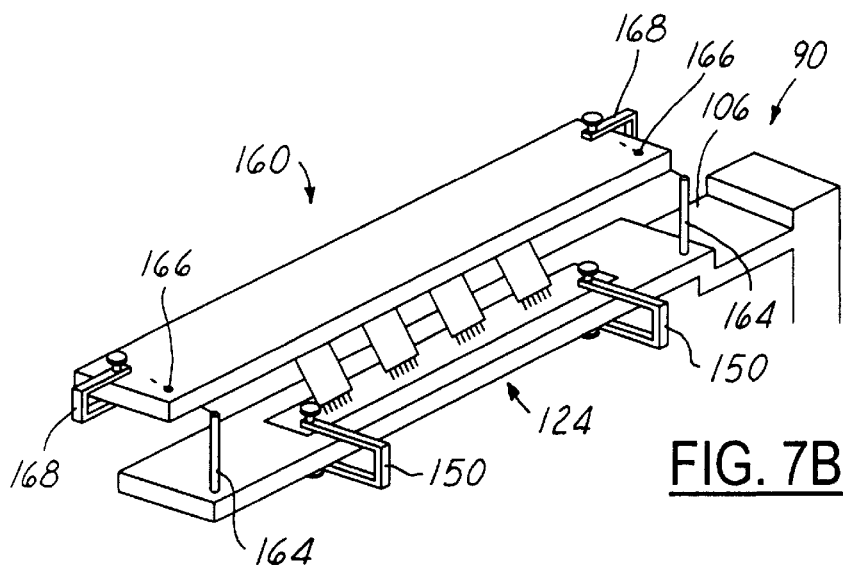
FIG. 7B is a perspective view of a side frame for the present invention adjustable test fixture with an upper plate positioned on top of the LCD panel and the side frame.
Figure 7C:
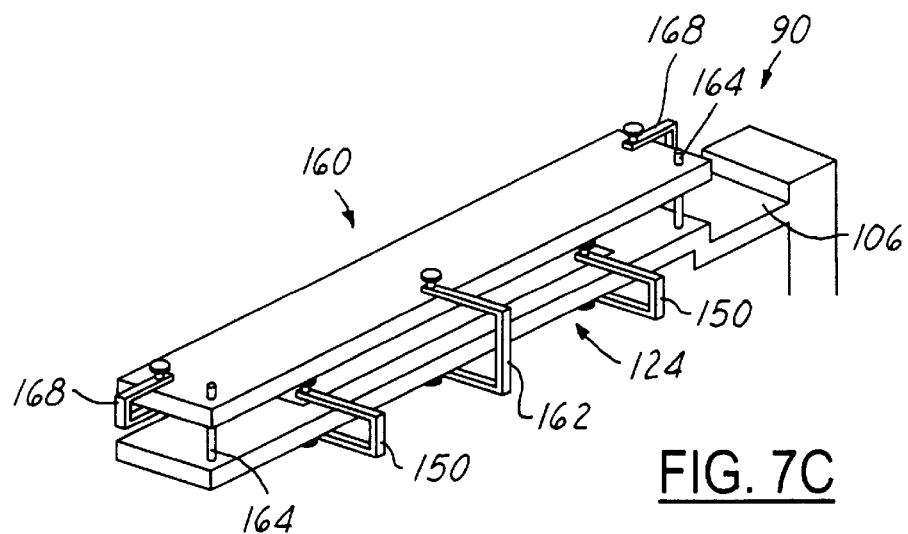
FIG. 7C is a perspective view of a side frame of the present invention adjustable test fixture with an upper plate clamped on top sandwiching an LCD panel thereinbetween.

The attachment means between the conductive elements (not shown) on the X card 116 and Y card 118 and the conductive leads on the TABs 20, 22 is shown in FIGS. 7 and 8. For instance, FIG. 7A shows that the LCD panel 10 which has TAB leads 20 positioned on a peripheral edge 120 are first positioned on the X card 116 which is a printed circuit board that is attached to the top surface 122 of the horizontal portion 124 of the third side frame 90. The X card 116 may be attached to the top surface 122 of the horizontal portion 124 of the third side frame 90 by any suitable mechanical means. As shown in FIG. 7A, the X card 116 is attached to the top surface 122 by a simple mechanical device of a C-clamp 150. A detailed view of the C-clamp 150 is also shown in FIG. 8C complete with attachment screws 152 and threaded apertures 154.

After the LCD panel 10 is accurately positioned with the conductive leads on the TAB 20 contacting the conductive elements on the X card 116, an upper plate 160 may be used to apply a suitable pressure for ensuring proper contact between the conductive leads and the conductive elements. The attachment of the upper plate 160 to the horizontal portion 124 of the side frame 90 can be further achieved by a C-clamp 162. The locating of the upper plate 160 on the horizontal portion 124 can be assisted by locating pins 164 and locating holes 166. A detailed construction of the upper plate 160, i.e., specifically the underside of the upper plate 160 is shown in FIGS. 8A, 8B, 8D and 8E.

Referring now to FIG. 8A which shows a present invention upper plate 160 complete with attachment means, i.e., clamps 168 and set screws 172. Locating holes 166 are provided for proper positioning of the plate on the top surface 122 of the horizontal portion 124. The bottom side 180 of the upper plate 160 is shown in FIG. 8B. The bottom surface 180 of the upper plate 160 may be attached to a ridge plate 188 which has a concave surface 184 for accommodating flexible tubular sections 190. The flexible tubular section 190 is constructed of a pliable plastic material in a tubular form which has a diameter of approximately 3 mm and a length of approximately 2 mm. The ridge plate 188 may be attached to the bottom surface 180 of the upper plate 160 by the C-clamps 168 utilizing the set screws 172. The height of the ridge portion 182 can be suitably adjusted to fit each individual application depending on the compression force needed on the TAB connections on the LCD panel 10.

The use of the flexible tubular sections 190 is further illustrated in FIGS. 8D and 8E. The sections A and B, as shown in FIG. 8D are designed such that the circuit components on the printed circuit board are avoided when the ridge plate 188 is pressed on the printed circuit board. The pressure exerted on the TAB leads and the conductive elements on the printed circuit board is applied by the flexible tubular member 190 at pre-selected locations. It should be noted that, instead of using a separate ridge plate 188, the ridged portion 182 may be built into the bottom surface 180 of the upper plate 160. However, the use of a separate ridge plate 188 and the attachment of the plate to the upper plate 160 by the clamping means 168 provides additional flexibility in the location of clamping on the LCD panel.

The present invention novel test fixture and a method for using the fixture have therefore been amply demonstrated in the above descriptions and in the appended drawings of FIGS. 4–8E. While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

1. A method for testing an LCD panel in a power-up test by using an adjustable test fixture comprising the steps of:

providing an adjustable fixture which includes a test fixture constructed by four side frames each having an L-shape, a first side frame comprising a first vertical portion and a first horizontal portion, said first horizontal portion having a base portion and a tip portion extending horizontally outwardly from a top of said first vertical portion, said base portion having a recessed slot for slidingly engaging a fourth side frame, said top portion being adapted for slidingly engaging a recessed slot in a second side frame, a second side frame comprising a second vertical portion of substantially the same height as said first vertical portion and a second horizontal portion, said second horizontal portion having a base portion and a tip portion extending horizontally outwardly from a top of said second vertical portion, said base portion having a recessed slot for slidingly engaging said first side frame, said tip portion being adapted for slidingly engaging a recessed slot in a third side frame, a third side frame comprising a third vertical portion of substantially the same height as said second vertical portion and a third horizontal portion, said third horizontal portion having a base portion and a tip portion extending horizontally outwardly from a top of said third vertical portion, said base portion having a recessed slot for slidingly engaging said second side frame, said tip portion being adapted for slidingly engaging a recessed slot in a fourth side frame, a fourth side frame comprising a fourth vertical portion of substantially the same height as said third vertical portion and a fourth horizontal portion, said fourth horizontal portion having a base portion and a tip portion extending horizontally outwardly from a top of said fourth vertical portion, said base portion having a recessed slot for slidingly engaging said third side frame, said tip portion being adapted for slidingly engaging a recessed slot in said first side frame, and each of said first, second, third and fourth horizontal portions having a substantially flat top surface equipped with a multiplicity of conductive elements for establishing electrical communication with a LCD panel to be tested, and positioning an LCD panel on top of said adjustable fixture, said LCD panel having a multiplicity of conductive leads provided on at least one peripheral edge on at least one side of said panel for establishing electrical communication with said multiplicity of conductive elements on said side frame.

2. A method for testing an LCD panel in a power-up test according to claim 1 further comprising the step of pressing down on said multiplicity of conducting leads and said multiplicity of conductive elements by an upper plate to ensure electrical communication between said leads and said elements.

3. A method for testing an LCD panel in a power-up test according to claim 2 further comprising the step of clamping said upper plate to said horizontal portion of said side frame with said LCD panel and said conductive elements therein-between.

4. A method for testing an LCD panel in a power-up test according to claim 1, wherein said multiplicity of conductive elements are provided on a printed circuit board.

5. A method for testing an LCD panel in a power-up test according to claim 1, wherein said multiplicity of conductive leads on said LCD panel are provided in tape automated bonding (TAB) form.

6. A method for testing an LCD panel in a power-up test according to claim 1 further comprising the step of establishing electrical communication between said LCD panel and said test fixture by contacting TAB leads on said LCD panel with a printed circuit board (PCB) on said test fixture.

7. An adjustable fixture for LCD panel power-up test comprising:

a test fixture constructed by four side frames each having an L-shape, a first side frame comprising a first vertical portion and a first horizontal portion, said first horizontal portion having a base portion and a tip portion extending horizontally outwardly from a top of said first vertical portion, said base portion having a recessed slot for slidingly engaging a fourth side frame, said top portion being adapted for slidingly engaging a recessed slot in a second side frame, a second side frame comprising a second vertical portion of substantially the same height as said first vertical portion and a second horizontal portion, said second horizontal portion having a base portion and a tip portion extending horizontally outwardly from a top of said second vertical portion, said base portion having a recessed slot for slidingly engaging said first side frame, said tip portion being adapted for slidingly engaging a recessed slot in a third side frame, a third side frame comprising a third vertical portion of substantially the same height as said second vertical portion and a third horizontal portion, said third horizontal portion having a base portion and a tip portion extending horizontally outwardly from a top of said third vertical portion, said base portion having a recessed slot for slidingly engaging said second side frame, said tip portion being adapted for slidingly engaging a recessed slot in a fourth side frame, a fourth side frame comprising a fourth vertical portion of substantially the same height as said third vertical portion and a fourth horizontal portion, said fourth horizontal portion having a base portion and a tip portion extending horizontally outwardly from a top of said fourth vertical portion, said base portion having a recessed slot for slidingly engaging said third side frame, said tip portion being adapted for slidingly engaging a recessed slot in said first side frame, and each of said first, second, third and fourth horizontal portions having a substantially flat top surface equipped with a multiplicity of conductive elements for establishing electrical communication with a LCD panel to be tested.

8. An adjustable fixture for LCD panel power-up test according to claim 7, wherein said first, second, third and fourth horizontal portions have substantially the same length.

9. An adjustable fixture for LCD panel power-up test according to claim 7, wherein said multiplicity of conductive elements for establishing electrical communication with a LCD panel to be tested are provided on removable cards.

10. An adjustable fixture for LCD panel power-up test according to claim 9, wherein said removable cards having said multiplicity of conductive elements on top are mounted on said flat top surface by locating pins.

11. An adjustable fixture for LCD panel power-up test according to claim 7, wherein said top of said first, second, third and fourth vertical portions further comprising means for locking said tip portion of said horizontal portion in said recessed slot of an adjacent side frame.

12. An adjustable fixture for LCD panel power-up test according to claim 11, wherein said means for locking a tip portion to a recessed slot comprises a set screw and a threaded aperture in said top of said vertical portion of a side frame.

13. An adjustable fixture for LCD panel power-up test according to claim 7, wherein said electrical communication made between said multiplicity of conductive elements and said LCD panel is removable.

14. An adjustable fixture for LCD panel power-up test according to claim 7 further comprising a first multiplicity of conductive elements on a top planar surface of said first side frame for establishing electrical communication with a multiplicity of drive lines on said LCD panel.

15. An adjustable fixture for LCD panel power-up test according to claim 7 further comprising a second multiplicity of conductive elements on a top planar surface of said second side frame for establishing electrical communication with a multiplicity of gate lines on said LCD panel.

16. An adjustable fixture for LCD panel power-up test according to claim 7 further comprising a first multiplicity of conductive elements on a top planar surface of said first side frame for establishing electrical communication with a multiplicity of drive lines on said LCD panel and a second multiplicity of conductive elements on a top planar surface of said second side frame for establishing electrical communication with a multiplicity of gate lines on said LCD panel.

17. An adjustable LCD panel power-up test fixture comprising:
   a base plate having a sufficiently planar area adapted for accommodating at least three side frames for removably mounting to said plate, each of said at least three side frames having a substantially elongated body defined by a top planar surface and a parallel bottom planar surface, each of said top planar surface being equipped with a multiplicity of conductive elements for establishing electrical communication with an LCD panel to be tested,
   a first side frame removably mounted to said base plate, and
   at least a second side frame and a third side frame positioned on said base plate, said second side frame slidingly engaging said first side frame such that a pre-selected length of said first side frame required for testing said LCD panel is fixed, said third side frame slidingly engaging said second side frame such that a pre-selected length of said second side frame required for testing said LCD panel is fixed.

18. An adjustable LCD panel power-up test fixture according to claim 17, wherein said second side frame and said third side frame each being equipped with an upside-down U-shaped end portion for sliding on said first side frame and said second side frame, respectively.

19. An adjustable LCD panel power-up test fixture according to claim 18, wherein said upside-down U-shaped end portion further comprises means for locking said second side frame and said third side frame to said first side frame and said second side frame, respectively at a pre-selected length of the respective side frame for testing said LCD panel.

20. An adjustable LCD panel power-up test fixture according to claim 19, wherein said means for locking said first and second side frames together is a set screw.

21. An adjustable LCD panel power-up test fixture according to claim 17, wherein said multiplicity of conductive elements are provided on removable cards.

22. An adjustable LCD panel power-up test fixture according to claim 17 further comprising a fourth side frame positioned on said base plate slidingly engaging said third side frame such that a pre-selected length of said third side frame required for testing said LCD panel is fixed.

23. An adjustable LCD panel power-up test fixture according to claim 17, wherein said multiplicity of conductive elements are provided on removable cards mounted on said top planar surfaces on said side frames by locating pins.

24. An adjustable LCD panel power-up test fixture according to claim 17, further comprising a first multiplicity of conductive elements on a top planar surface of said first side frame for establishing electrical communication with a multiplicity of drive lines on said LCD panel.

25. An adjustable LCD panel power-up test fixture according to claim 17, further comprising a second multiplicity of conductive elements on a top planar surface of said second side frame for establishing electrical communication with a multiplicity of gate lines on said LCD panel.

26. An adjustable LCD panel power-up test fixture according to claim 17 further comprising a first multiplicity of conductive elements on a top planar surface of said first side frame for establishing electrical communication with a multiplicity of drive lines on said LCD panel, and a second multiplicity of conductive elements on a top planar surface of said second side frame for establishing electrical communication with a multiplicity of gate lines on said LCD panel.

\* \* \* \* \*